United States Patent [19]

Heald

[11] Patent Number: 4,482,909
[45] Date of Patent: Nov. 13, 1984

[54] SIGNAL EQUALIZATION IN QUADRILINEAR IMAGING CCD ARRAYS

[75] Inventor: David L. Heald, Solvang, Calif.

[73] Assignee: Xerox Corporation, Stamford, Conn.

[21] Appl. No.: 404,179

[22] Filed: Aug. 2, 1982

[51] Int. Cl.$^3$ .................... H01L 29/78; H01L 27/14; H01L 31/00; G11C 19/28
[52] U.S. Cl. ...................................... 357/24; 357/30; 377/58; 377/60; 377/61
[58] Field of Search ................. 357/24, 30; 377/57-63

[56] References Cited

U.S. PATENT DOCUMENTS

| Re. 30,917 | 4/1982 | Hagiwara et al. | 377/62 |
| 3,660,697 | 5/1972 | Berglund | 357/24 R |
| 3,937,985 | 2/1976 | Cooper | 357/24 R |
| 3,983,573 | 9/1976 | Ishihara | 357/24 LR |
| 4,010,485 | 3/1977 | Sauer | 357/24 R |

OTHER PUBLICATIONS

Beynon et al., Eds. *Charge-Coupled Devices and Their Applications* McGraw-Hill (UK), Ltd., London, 1980, pp. 50-55, 84, 85.
Brodersen et al., "Experimental Characterization of Transfer Efficiency in Charge-Coupled Devices", IEEE Trans. Electron Devices vol. ED-22, (2/75), pp. 40-46.
Carnes et al., "Fast-Interface-State Losses in Charge-Coupled Devices" Appl. Phys. Lett., vol. 28, (Apr. 1, 1972), pp. 261-263.

*Primary Examiner*—Gene M. Munson
*Attorney, Agent, or Firm*—Franklyn C. Weiss

[57] ABSTRACT

In the operation of a high density quadrilinear CCD imaging array, photogenerate charge is transferred from the photosites, transversely through one inner CCD register to a second outer CCD register, before clocking the CCD registers. During the transfer from the inner to the outer registers, the signal charge passes through a region defined by boundaries spaced relatively widely to a region in which the boundaries are required to be spaced closely. In the latter region, two dimensional fringing fields from the boundaries elevate the minimum potential which defines the signal charge path and creates a potential step which traps a significant percentage of the signal charge. This trapping creates a large offset between the output signals from the inner and outer register. The concept proposed is to use a fat zero, i.e., an intentionally introduced small packet of charge, injected into the input of both the inner and outer CCD registers in order to totally eliminate the offset. The input structure for fat zero injection would be designed so that the size of the fat zero would be determined by the same factors creating the potential step, thereby totally eliminating any charge loss from the signal packet during the initial transfer from the photosites, and eliminating any dependance on processing variations.

3 Claims, 4 Drawing Figures

SIGNAL EQUALIZATION IN QUADRILINEAR IMAGING CCD ARRAYS

The invention relates to high density quadrilinear CCD imaging arrays wherein a large voltage potential offset may exist between the output signals from the inner and outer registers of the quadrilinear array. A fat zero, that is, an intentionally introduced small packet of charge, is injected into the input of both the inner and outer CCD registers in order to totally eliminate the offset.

BACKGROUND OF THE INVENTION

Charge coupled devices, CCDs, have application both to storage of signals, i.e., memories, and in detection of light information, i.e., image arrays. CCDs have been utilized both in random access memories and also in scanning arrays for both television pictures and line scanners.

However, an important characteristic of a charge coupled device is the efficiency at which the charge is transferred from one stage to another. In an article in the IEEE Transactions on Electron Devices, Volume ED-22, number 2, February 1975, Page 40, entitled "Experimental Characterization of Transfer Efficiency In Charge-Coupled Devices", there is disclosed a method of determining the minimum fat zero which eliminates fixed loss. In a book entitled "Charge Coupled Devices and Systems" by M. J. Howes and D. V. Morgan, John Wiley and Sons, copyrighted in 1979, on Page 179 thereof, is discussed that one of the levels of the binary signal in a CCD memory loop is a full well while the other level is an empty well. In practice, however, in order to assure a good transfer efficiency, the full well signal represents a charge signal that fills only about 80 percent to 90 percent of the potential well. Also, in the case of surface-channel CCDs, the "zero" signal usually represents some finite level of charge signal. This minimum level of charge signal required to reduce the charge trapping losses due to the fast interface states in the surface-channel CCDs, has been referred to as the "fat zero" signal.

According to the present invention, a high density quadrilinear CCD imaging array, in which a series of photosites absorb light and collect the electrons thereby generated, is disclosed wherein the electrons are transferred to an outer register passing through an inner register and thus are subject to a potential step created by two dimensional fringing fields. The inner registers and outer registers would each have an input diode, followed by two additional cells and an electron sink in order to serve as the drain of excess electrons from the cells in which the fat zero charge packets are created. When the full well of electrons is injected into the following cell, most of the electrons are bled off into the electron sink. Both of these extra cells would be structured identically to cells in the remainder of the CCD registers, with the exception that there are no photosites to supply charges.

DESCRIPTION OF THE DRAWINGS

For a more complete understanding of the invention, reference may be had to the following detailed description of the invention in conjunction with the drawings wherein.

DETAILED DESCRIPTION OF THE INVENTION

Figure 1:
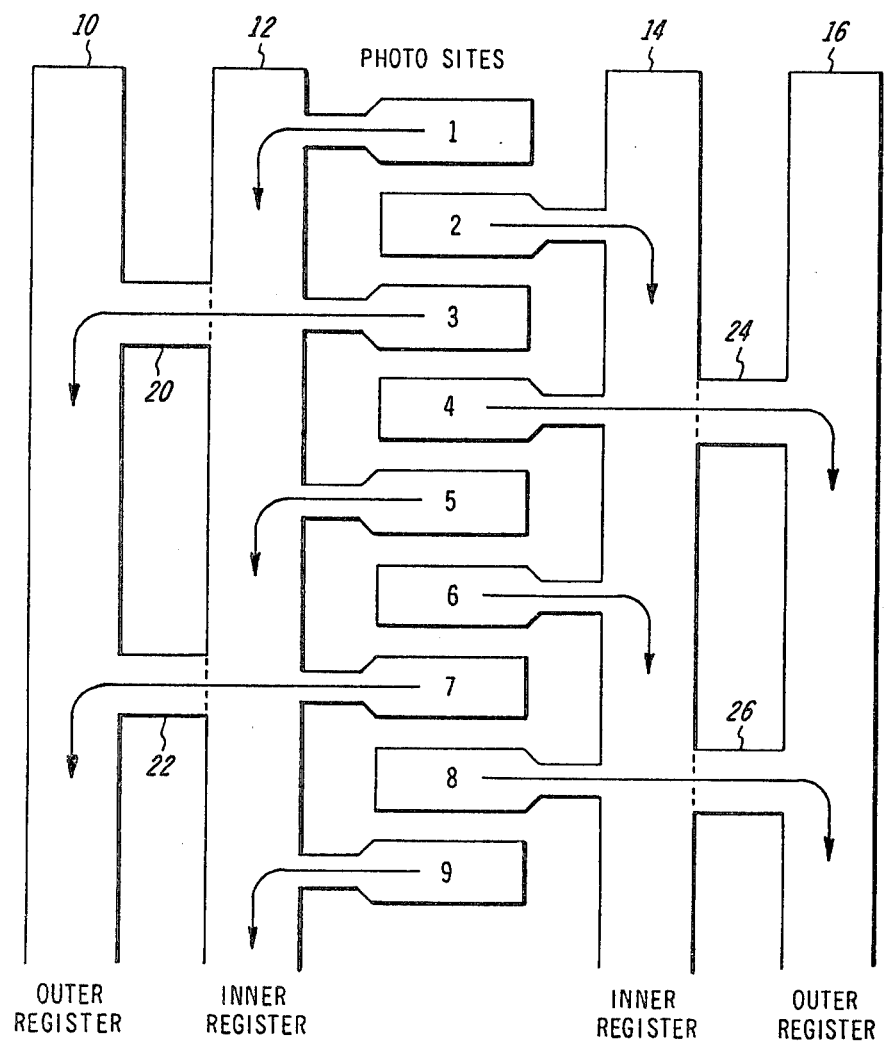
FIG. 1 shows a quadrilinear CCD array indicating the location of the voltage potential step.

The concept herein described addresses a fundamental problem which occurs in a high density quadrilinear CCD imaging array. In such a structure, there is a series of photosites which absorb light and collect the electrons thereby generated (for an n-channel device). The collected electrons are then transferred to inner and outer CCD shift registers located on both sides of the photosites. Inevitably, when the electrons are transferred to the outer register they must pass through the inner register, and, in so doing, they transfer from a wide region to a narrow region defined by the thick field oxide and channel stopped area shown in FIG. 1. For example, in FIG. 1, photosites 1 to 9 are shown; but typical examples of a CCD linear array could include as many as 1756 or 3600 photosites, for example. In order to process the information more quickly, selected ones in a predetermined pattern of the photosite areas are transferred to particular output registers. That is, for example, the charges collected in photosites 1, 5, and 9 would be transferred to the inner register 12, photosites 2 and 6 would be transferred to inner register 14, photosites 3 and 7 would be transferred to outer register 10 while photosites 4 and 8 would be transferred to outer register 16. These procedures would be taking place during selected clock pulses which would control the movement of the electrons indicating amounts of light that have been impinged upon the photosites to the selected inner and outer registers. Then high speed clocks would transfer the data on each of the inner and outer registers to separate circuitry either on the CCD array or off the CCD array and subsequent circuitry would realign, i.e., multiplex, the data so that the electrical signals representative of the line of data impinged upon the line of photosites would appear in the proper order.

FIG. 1 shows that when the information from photosite areas 3 and 7 are being transferred to outer output register 10 and photosite areas 4 and 8 are being transferred to outer shift register 16, the data must pass through the inner registers 12 and 14, respectively, and pass from a wide region in shift registers 12 and 14 to a narrow region 20, 22, 24, and 26 defined by the thick field oxide and channel stop areas as shown in the figure as formed during manufacture of the CCD array itelf. This transition from a wide to a narrow region involves a potential step created by two dimensional fringing fields. The step can be controlled and minimized by various processing techniques, but it cannot be eliminated and particularly for dense, small geometry arrays will cause an objectionable imbalance between the inner and outer register signal levels at the output end of the CCD array.

The fat zero has been used in the past to pre-fill surface states in surface channel CCDs, but in the present invention it is used to pre-fill the potential well which traps charge during the transfer from the inner to the outer shift registers in a quadrilinear CCD imaging array. Since this charge will be added to the signal levels at the output of the inner shift registers, the fat zero should also be introduced into the output shift registers to eliminate the offset between the inner and outer registers totally. This concept could be implemented in a 2, 3, or 4 phase CCD but is described herein below for 2 phase CCD array.

Figure 2:
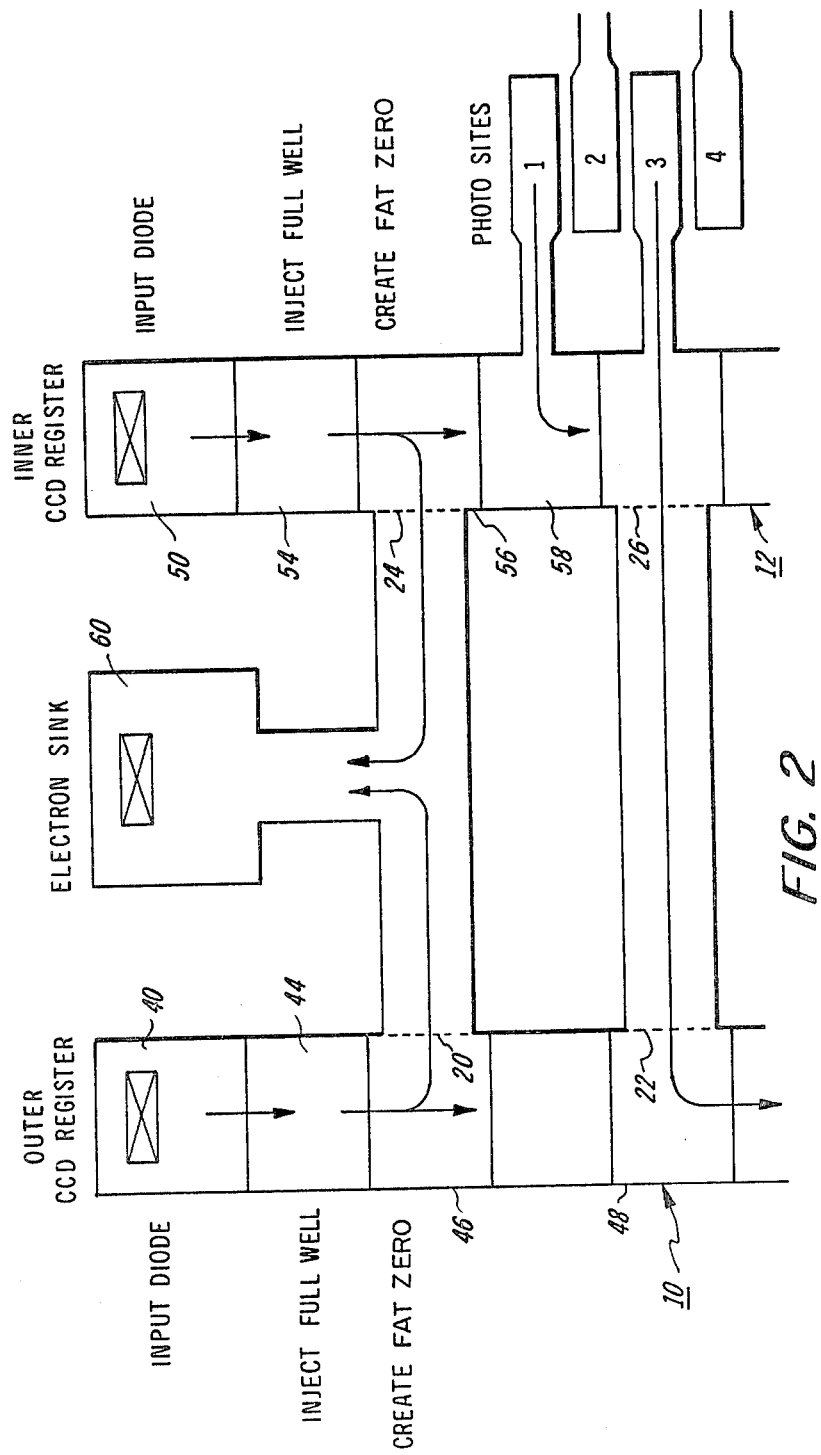
FIG. 2 is the quadrilinear CCD array of FIG. 1 showing the additional structure in accordance with the principles of the present invention.

In order to inject the fat zero into the CCD registers, additional structures would have to be added at the input end of the CCD registers, prior to the first photosite. Each register would have an input diode, followed by two additional cells and an electron sink as shown in FIG. 2. Photosites 1 through 4 are seen in FIG. 2 wherein photosite 1 releases its stored electron charge to storage area 58 upon receipt of the proper clock signal. At the input end of storage register 12 would be the input diode 50. The input diode 50 would inject a full electron charge to storage cell 54. When the charge is transferred from storage area 54 to storage cell 56, a certain amount of the electron charge would be tapped off and returned to electron sink 60 which is a reverse biased diode. Similarly, in outer CCD register 10, input diode 40 would inject an electron charge into storage cell 44 similar to the manner for storage cell 54. The fat zero charge is generated in storage cell 46 when a certain predetermined amount of charge is drained from the storage cell back to the electron sink 60. The fat zero charge would then transfer along until it reaches the amount of electrons transferred into storage cell 48 from photosite number 3. For photosites 2 and 4, and the other even numbered photosites, such structure would also be existing for the other two registers in the quadrilinear array.

Thus, the electron sink 60 would be connected to a power supply and serves to drain off excess electrons from cells 46 and 56 in which the fat zero charge packets are created. The input diode 40, 50 for each register 10, 12 would be biased in such a fashion that a full well of electrons would be injected into the next cell of each CCD during each complete cycle, with a fill and spill technique which is commonly used in CCD devices. When the full well of electrons is injected into the following cell 46, 56 most of the electrons are bled off into the electron sink 60. Both of these extra cells would be structured identically to the cells in the remainder of the CCD registers 10, 12, with the exception that there are no photosites to supply charges.

Figure 3:
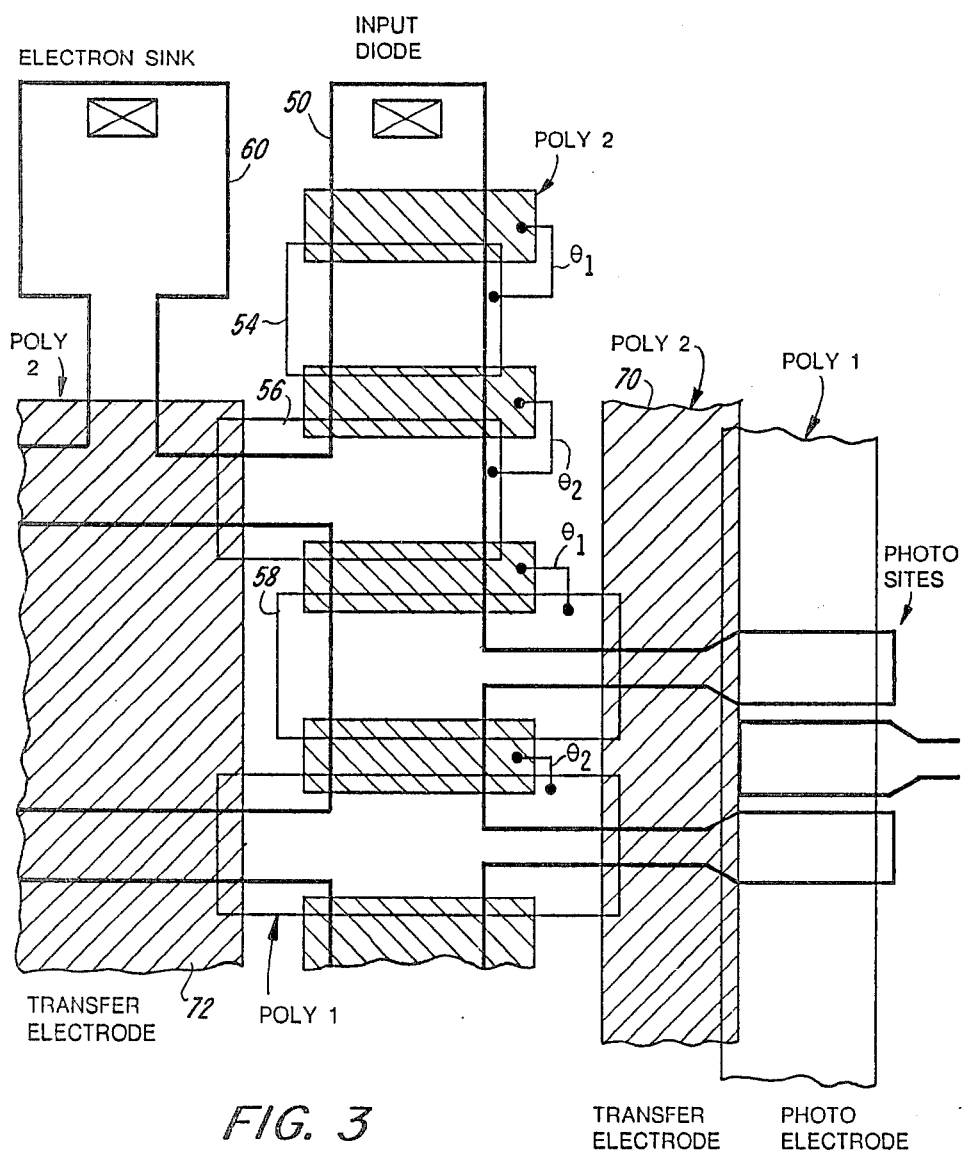
FIG. 3 shows the detailed structure for one CCD register of the CCD array shown in FIG. 1 in accordance with the principles of the present invention.
Figure 4A:
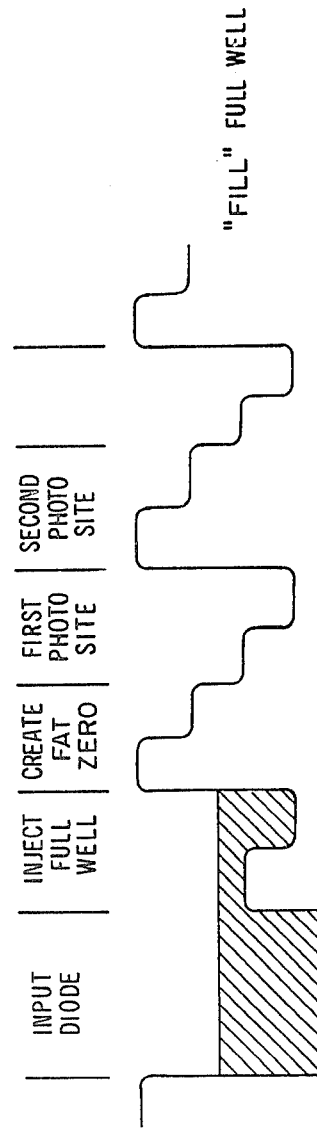
FIG. 4 shows sequential diagrams for the timing down a CCD register for the electrical potential which governs the creation and injection of the fat zero into the CCD.
Figure 4B:
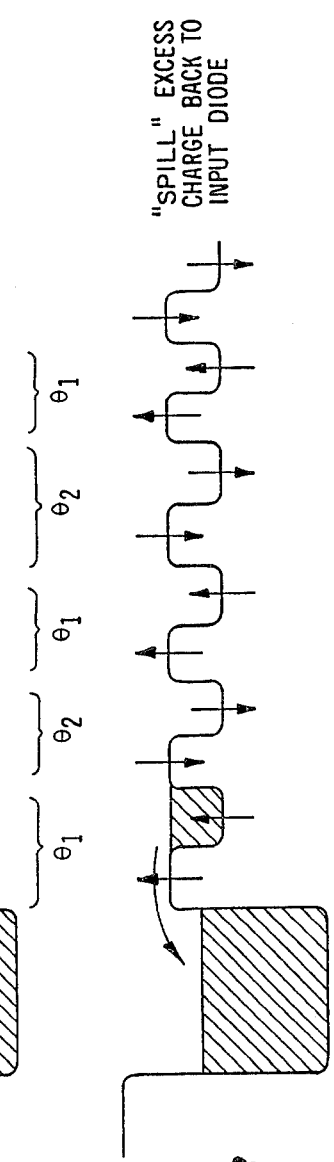
Figure 4C:
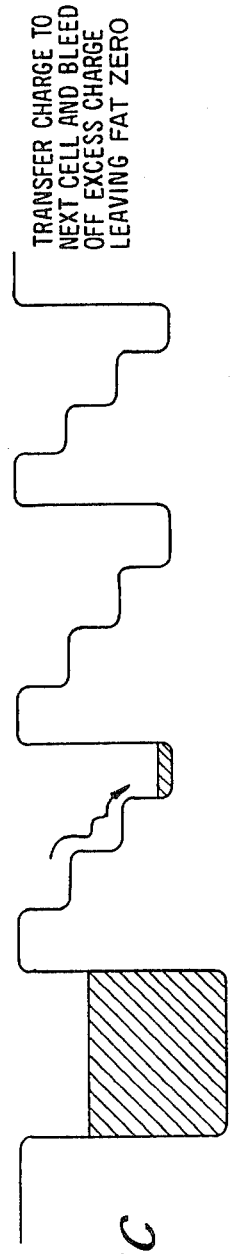
Figure 4D:
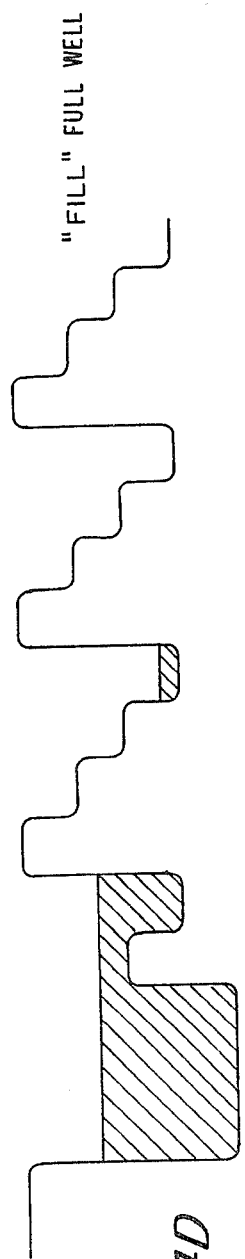
Figure 4E:
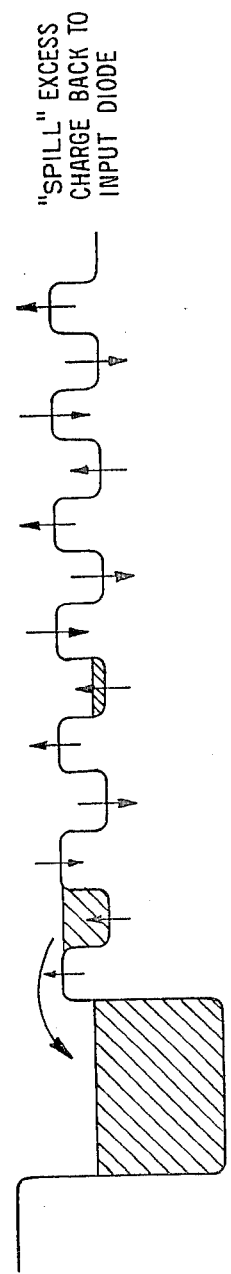

FIG. 3 shows a detailed drawing of one CCD register which includes the controlling electrodes. Seen in FIG. 3 are the photosites 1, 2, and 3, all the rest as set forth above not being shown for ease of illustration. The other reference numerals are similar to those in FIGS. 1 and 2 for ease of description. Thus, the electrons underneath photosite number 1 would be transferred via the transfer electrode 70 to storage cell 58. The input diode 50 would generate the electron charge which would be transferred into storage cell 54 at phase 1. At phase 2, the charge stored at location 54 would be transferred to storage location 56 during the phase 2 clock time. Some of the charge would be drained off via transfer electrode 72 back to the electron sink 60. With only phase 1 and phase 2 being delineated, this particular embodiment is termed a 2-phase device. Storage cell 54, 56, and 58 would be comprised of a first layer of polycrystalline silicon over the substrate material. The intermediate layers between the enumerated areas would comprise a second layer of polycrystalline silicon used as transfer electrodes. For the structure shown in FIG. 3, there are no additional processing steps required over that conventionally used for the processing of CCDs, and moreover there are no required modifications to any of the existing processing steps. There is only a design change on the mask set.

In FIGS. 2 and 3, the unnumbered rectangles with diagonal lines therein would be contacts on the input and output diodes for connection to external circuitry.

FIG. 4 shows sequential diagrams for the timing down the CCD register for the electrical potential which governs the creation and injection of the fat zero into the CCD. When the phase 1 clock is reduced in potential, electrons from in the input diode fill the well adjacent to the diode, as shown in FIG. 4a. When the phase 1 clock begins to rise in potential, excess electrons spill back into the input diode, leaving a full well of electrons as shown in FIG. 4b. When the phase 1 clock reaches its maximum potential and the phase 2 clock simultaneously reaches its minimum potential, the full well of electron transfers to the next polycrystalline silicon storage area which is the cell in which the fat zero is to be created. When the electrons transfer into this cell, the majority of electrons then again transfer into the electron sink shown in FIG. 2. Finally, the residual amount of charge left behind because of the potential step discussed earlier remains in the well shown in FIG. 4c. The cycle repeats so that for each charge transfer in the CCD, a fat zero is injected at the input. This injection takes place continuously so that after the charges in the photosites are transferred into the CCD registers and are then transferred down the CCD itself, fat zeros fill up the cells being emptied. Thus, the photo induced charge is transferred down the CCDs, the cells are all simultaneously precharged with the fat zero and are ready to accept the next set of photo-induced charges. No extra time is required in the operation of the CCD to inject fat zeros.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A charge coupled device imaging array wherein photogenerated charge is transferred from a row of photosites to an immediately adjacent first row of CCD memory cells comprising an inner CCD register and to a second row of CCD memory cells next to said first row of CCD memory cells comprising an outer CCD register through said inner register, means for introducing a fat zero electron charge into said inner and outer registers to eliminate the offset in charge being transferred through said inner register to said outer register and the charge only to said inner register, said means for introducing a fat zero electron charge comprising:

first circuit means at each input end of said inner and outer registers for introducing a predetermined charge into said inner and outer registers, and second circuit means coupled to each of said inner and outer registers for draining off predetermined amounts of charge each, the charge remaining at the input ends of said registers defining the fat zero charges introduced into said charges transferred from said row of photosites.

2. The imaging array as set forth in claim 1 wherein said first circuit means comprises an input diode and additional CCD memory cells for each of said input and output registers, said input diode injecting a full electron charge to the next memory cell, and electron sink means for draining off predetermined amounts of said full electron charge, the remaining amounts of charge in said additional memory cells being said fat zero charge.

3. A charge coupled device linear imaging array comprising;
 a row of photosite areas for detecting light impinged thereon and storing charge representative of the amount of said light impinging each said photosite areas,
 a first row of CCD memory cells next to said photosite areas said first row comprising an inner shift register,
 a second row of CCD memory cells next to said first row of CCD memory cells, said second row comprising an outer shift register,
 said inner shift register receiving and storing the charge from alternate ones of said photosite areas and transferring to said outer shift register the charge from intermediate ones of said alternate photosite areas, said outer shift register receiving and storing said charge from said intermediate ones of said alternate photosite areas,
 an input diode and additional CCD memory cells at one end of each of said inner and outer shift registers, said input diodes injecting a full electron charge to the first next immediate memory cells,
 electron sink means coupled to each second next immediate memory cells for draining off predetermined amounts of said full electron charge when transferred from said first next immediate memory cells to said second next immediate memory cells, the remaining amounts of charge in said second next immediate memory cells being introduced into the cell in said register receiving charge from said photosite area to offset any charge potential difference in the charge received at said inner and outer shift registers.

* * * * *